United States Patent [19]

Qureshi et al.

[11] Patent Number: 4,989,221
[45] Date of Patent: Jan. 29, 1991

[54] SAMPLE RATE CONVERTER

[75] Inventors: Shahid U. H. Qureshi, Natick; Fuyun Ling, Jamaica Plain, both of Mass.

[73] Assignee: Codex Corporation, Mansfield, Mass.

[21] Appl. No.: 431,712

[22] Filed: Nov. 2, 1989

Related U.S. Application Data

[63] Continuation of Ser. No. 32,165, Mar. 30, 1987, abandoned.

[51] Int. Cl.[5] ............................................. H04B 1/38
[52] U.S. Cl. ........................................ 375/8; 379/406; 370/32.1; 375/118
[58] Field of Search ............... 379/398, 400, 406, 410, 379/411; 370/32.1, 32; 375/12, 8, 110, 14, 118, 119; 364/724 X, 724.1; 328/155; 333/28 R, 18

[56] References Cited

U.S. PATENT DOCUMENTS

| Re. 31,253 | 5/1983 | Weinstein | 179/170.2 |
|---|---|---|---|
| 3,754,098 | 8/1973 | Abramson et al. | 178/69.5 |
| 4,027,100 | 5/1977 | Ishiguro | 178/69.1 |
| 4,054,747 | 10/1977 | Pachynski, Jr. | 375/118 |
| 4,119,796 | 10/1978 | Jones | 178/69.1 |
| 4,146,840 | 3/1979 | McRae et al. | 375/119 X |
| 4,161,633 | 7/1979 | Treiber | 179/170.2 |
| 4,162,378 | 7/1979 | Baudoux et al. | 179/170.2 |
| 4,181,975 | 1/1980 | Jenkins | 364/900 |
| 4,242,755 | 12/1980 | Gauzan | 375/114 |
| 4,270,183 | 5/1981 | Robinson et al. | 364/900 |
| 4,323,790 | 4/1982 | Dunning et al. | 370/102 |
| 4,343,759 | 8/1982 | Kustka et al. | 364/724 X |
| 4,355,214 | 10/1982 | Levy et al. | 179/170.2 |
| 4,362,909 | 12/1982 | Snijders et al. | 179/170.2 |
| 4,453,259 | 6/1984 | Miller | 375/106 |
| 4,460,890 | 7/1984 | Busby | 364/724.1 X |
| 4,481,385 | 11/1984 | Kalfs | 179/170.2 |
| 4,539,674 | 9/1985 | Carlqvist et al. | 370/32 |
| 4,539,675 | 9/1985 | Fisher | 370/32 |
| 4,549,048 | 10/1985 | Combier | 179/170.2 |
| 4,571,465 | 2/1986 | Brie et al. | 179/170.2 |
| 4,575,860 | 3/1986 | Scordo | 375/110 |
| 4,668,917 | 5/1987 | Levine | 328/155 X |
| 4,825,398 | 4/1989 | Koch | 364/724.1 |

OTHER PUBLICATIONS

Ronald W. Shafer et al., "A Digital Signal Processing Approach to Interpolation", Proceedings of the IEEE, vol. 61, No. 6, Jun. 1973.

Stephen B. Weinstein, "A Passband Data-Driven Echo Canceller for Full-Duplex Transmission on Two-Wire Circuits", IEEE Transactions on Communications, vol. COM-25, No. 7, Jul. 1977.

(List continued on next page.)

Primary Examiner—Jin F. Ng
Assistant Examiner—Jhanay Augustus
Attorney, Agent, or Firm—Fish & Richardson

[57] ABSTRACT

A sample rate converter receives an input stream of samples representative of a time-varying signal and generates a corresponding output stream of samples which is also representative of the time-varying signal and in which each output stream sample appears at a desired time which may differ from the time when a sample appears in the input stream; filter circuitry receives the input stream and generates at least two intermediate samples which appear at different times, and interpolation circuitry combines selected intermediate samples to form a sample of the output stream at the desired time. In another aspect, an improvement is provided for a modem of the kind in which a line signal is sampled at times governed by an unstable clock to generate a first sample stream in which the samples appear with possibly changing sampling phases and a converter converts the first sample stream to a second stream of samples appearing at times that are possibly different from the times of appearance of the samples in the first sample stream; the improvement is means for providing to the converter signals representative of the changing phases of the samples in the first sample stream to cause the conversion to occur in a manner that reduces the contribution of the changing sampling phases to the times of appearance of the samples in the second sample stream.

24 Claims, 3 Drawing Sheets

OTHER PUBLICATIONS

Jean-Jacques Werner, "An Echo-Cancellation-Based 4800 Bit/s Full-Duplex DDD Modem", IEEE Journal on Selected Areas in Communication, vol. Sac-2, #5, 9/84.

Niek A. M. Verhoeckx et al., "Digital Echo Cancellation for Baseband Data Transmission", *IEEE Transactions on Acoustics, Speech, and Signal Processing*, vol. ASSP-27, No. 6, Dec. 1979.

Tomoki Ohsawa et al., "Adaptive Rate Conversion Filter", ICASSP 86, Tokyo.

Ronald E. Crochiere et al. *"Optimum FIR Digital Filter* Implementations for Decimation, Interpolation, and Narrow-Band Filtering", Oct. 1975, IEEE Transactions on Acoustics, Speech, and Signal Processing, vol. ASSP-23, #5.

Claude E. Shannon, "Communication in the Presence of Noise", Proc. of I.R.E., Jan. 1949, p. 10.

B. M. Oliver et al., "The Philosophy of PCM", Proc. of I.R.E., Nov. 1948, p. 1324.

European Search Report, EP 88 30 2877, 1/12/90.

Urkowitz, "Parallel Realizations of Digital Interpolation Filters for Increasing the Sampling Rate," IEEE Transactions on Circuits and Systems, vol. 1, CAS-22, No. 2, Feb. 1975.

Ramstad, "Digital Methods for Conversion Between Arbitrary Sampling Frequencies," IEEE Transactions on Acoustics, Speech and Signal Processing, ASSP-32, No. 3, Jun. 1984.

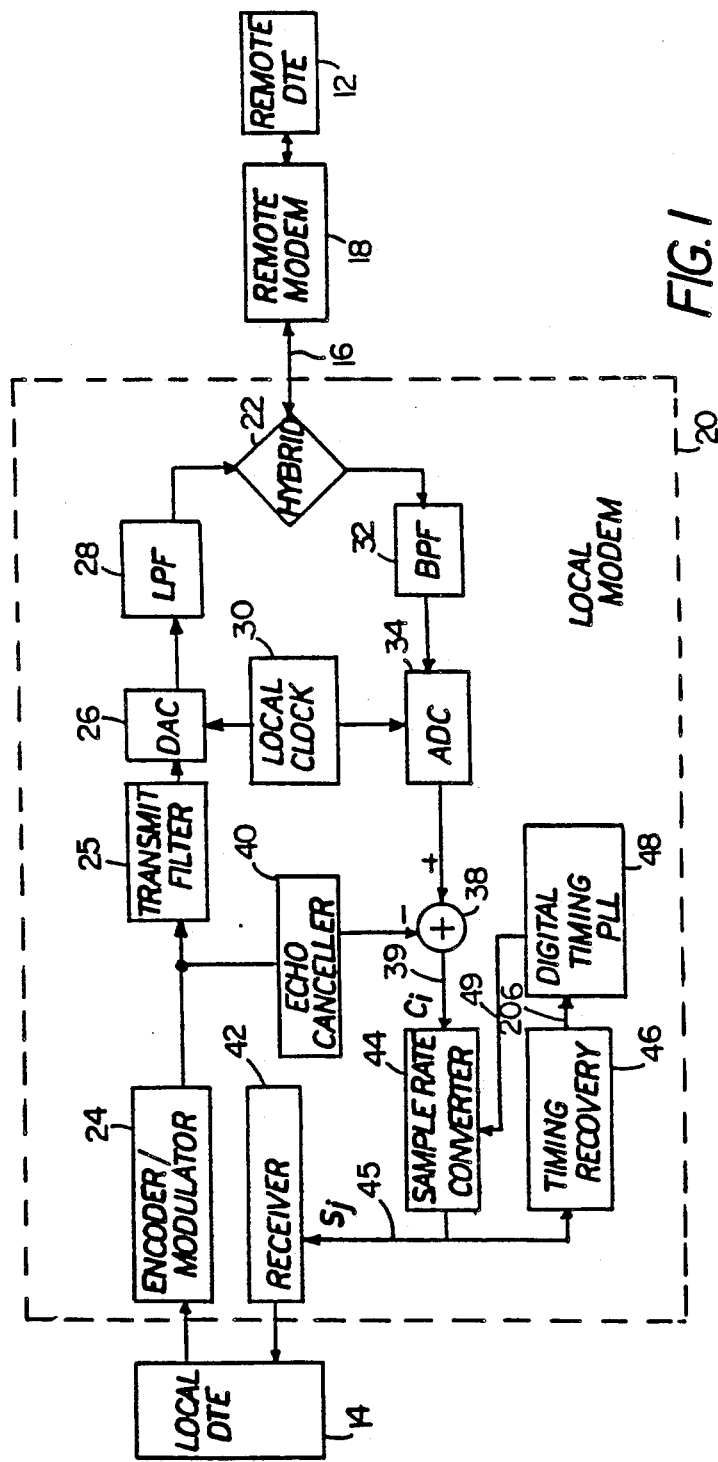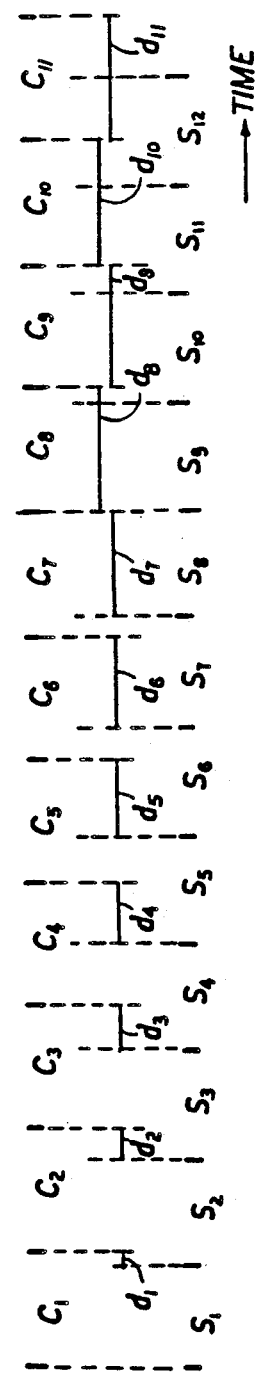

SAMPLE RATE CONVERTER

This is a continuation of copending application Ser. No. 032,165 filed on Mar. 30, 1987 now abandoned.

BACKGROUND OF THE INVENTION

This invention relates to converting a stream of signal samples appearing at one sample rate into a stream of signal samples that carry the same information but appear at a different sample rate.

In modems used for full duplex communication over a two-wire voice-band telephone line, for example, the process of echo cancellation requires sampling the line signal at a first sampling rate that is related to (typically a multiple of) the local transmitter's baud rate. The sample stream is then subjected to echo cancellation by subtracting a sample stream (appearing at the same first sampling rate) that represents echo and leakage versions of the locally transmitted signal.

For decoding, however, the echo cancelled sample stream must be converted to a new sample stream that carries the same information but appears at a second sampling rate that is related to (typically a multiple of) the remote transmitter's baud rate. Commonly the remote and local transmitter baud rates are nominally the same but actually differ slightly.

It is known to accomplish sample rate conversion in the analog domain by converting the echo cancellation signal to analog, subtracting it from the analog received line signal, then reconverting the result to the digital domain at the desired second sampling rate, for decoding.

Alternatively, the echo cancellation may proceed in the digital domain (at the first sampling rate). The digital result is then converted to analog and reconverted to digital (at the second sampling rate).

It is well known that if an analog signal is sampled at a sufficiently high rate, the resulting samples will contain enough information to permit the original signal to be reconstructed perfectly. It is also known that by passing the samples through a transversal filter having a properly chosen set of coefficients, a new sample stream can be generated such that the new sample stream appears at any desired sample rate and, like the original sample stream, accurately represents the information in the original analog signal.

Miller, U.S. Pat. No. 4,453,259, shows a modem in which samples of the line signal appearing at a first fixed rate are passed through an interpolation filter to generate a revised sample stream at a second rate. By selecting an appropriate one of several sets of filter coefficients, the second sample rate can be made to be any one of several different rates.

Weinstein, U.S. Pat. No. 4,131,767, shows an echo cancellation digital modem for full duplex communication in which the line signal is sampled at the Nyquist rate, then echo cancelled, and then resampled at the baud rate. One technique suggested for accomplishing the resampling is an "interpolation formula".

SUMMARY OF THE INVENTION

A general feature of the invention is in receiving an input stream of samples representative of a time-varying signal and generating a corresponding output stream of samples which is also representative of the time-varying signal and in which each output stream sample appears at a desired time which may differ from the time when a sample appears in the input stream; filter circuitry receives the input stream and generates at least two intermediate samples which appear at different times; and interpolation circuitry combines selected intermediate samples to form a sample of the output stream at the desired time.

Preferred embodiments include the following features.

The filter circuitry includes a plurality of sets of coefficients each set for generating one of the intermediate samples, and a plurality of transverse filters for generating the intermediate samples using two or more different sets of coefficients. Each coefficient set is chosen to be substantially flat in the frequency band represented by the time-varying signal and to have an envelope delay characteristic that differs from the envelope delay characteristics of another set by an amount which is nearly constant as a function of frequency within the passband.

The output sample rate may differ from the input sample rate. The input stream is samples of a line signal generated by a modem and the output stream is samples used by the modem to derive data sent over the line. The modem may be a full-duplex, echo cancellation modem, the input sample stream appears at a rate related to the transmission baud rate of the modem, and the output stream appearing at a rate related to the transmission baud rate of a modem at the other end of the line. The difference between sampling phase of the input stream and sampling phase of the output stream varies over time, and the intermediate samples are selected and the interpolation circuitry is controlled based on the varying difference.

The interpolation ciruitry includes a switch for selecting two intermediate samples, and combining circuitry for performing a linear interpolation between the two intermediate samples. The coefficients for the linear interpolation are based on a measure of the difference betweeen the sampling phases of the input stream and sampling phases of the output stream.

The input sample stream is sampled by a clock derived from an unstable clock having a nominally fixed rate subject to jitter and frequency shifts; the output stream appears at a nominally fixed rate; and means are provided for reducing the jitter and frequency shifts in the unstable clock. A buffer temporarily stores the input stream samples for delivery to the filter circuitry, the samples being stored in the buffer at a first rate which is derived indirectly from an external clock, the samples being accepted by the filter circuitry at a possibly different average second rate based on said external clock, the occupancy status of the buffer being monitored to cause the average second rate to be adjusted so that the buffer is normally not full or empty.

Another general feature of the invention is an improvement in a modem of the kind in which a line signal is sampled at times governed by an unstable clock to generate a first sample stream in which the samples appear with possibly changing sampling phases, and in which a converter converts the first sample stream to a second stream of samples appearing at times that are possibly different from the times of appearance of the samples in the first sample stream. The improvement is a means for providing to the converter signals representative of the changing sampling phases in the first sample stream to cause the conversion to occur in a manner that reduces the contribution of the changing sampling phases to the times of appearance of the samples in the second sample stream.

Preferred embodiments include the following features.

The unstable clock is either provided from a data terminal equipment associated with the modem, or is derived from the second sample stream. A stable clock delivers pulses at a nominal rate related to the rate of pulses of the unstable clock, and the means for providing signals generates the signals based on detecting changes in phase of the unstable clock pulses relative to the pulses of the stable clock. The means for providing signals includes an add or delete pulse circuit for generating a derived clock from the stable clock by adding or deleting pulses to or from the stable clock, and a comparator for generating comparisons of the phases of the unstable clock pulses with the phases of pulses of the derived clock; and the add or delete pulse circuit operates in response to the comparisons.

The invention enables efficient accurate generation of an output sample stream having any desired sampling phases while representing the same underlying time-varying signal as the original signal. Only a relatively small number of coefficient sets need be stored. The invention is especially useful for sample rate conversion in a digital full-duplex, echo cancellation modem. Jitter and frequency shifts in the sampling phases of the output sample stream are reduced.

Other advantages and features of the invention will become apparent from the following description of the preferred embodiment, and from the claims.

DESCRIPTION OF THE PREFERRED EMBODIMENT

We first briefly describe the drawings.

DRAWINGS

FIG. 1 is a block diagram of a duplex communication system using echo cancellation modems.

FIG. 2 is a diagram of input and output samples of the sample rate converter of FIG. 1.

STRUCTURE AND OPERATION

Figure 3:
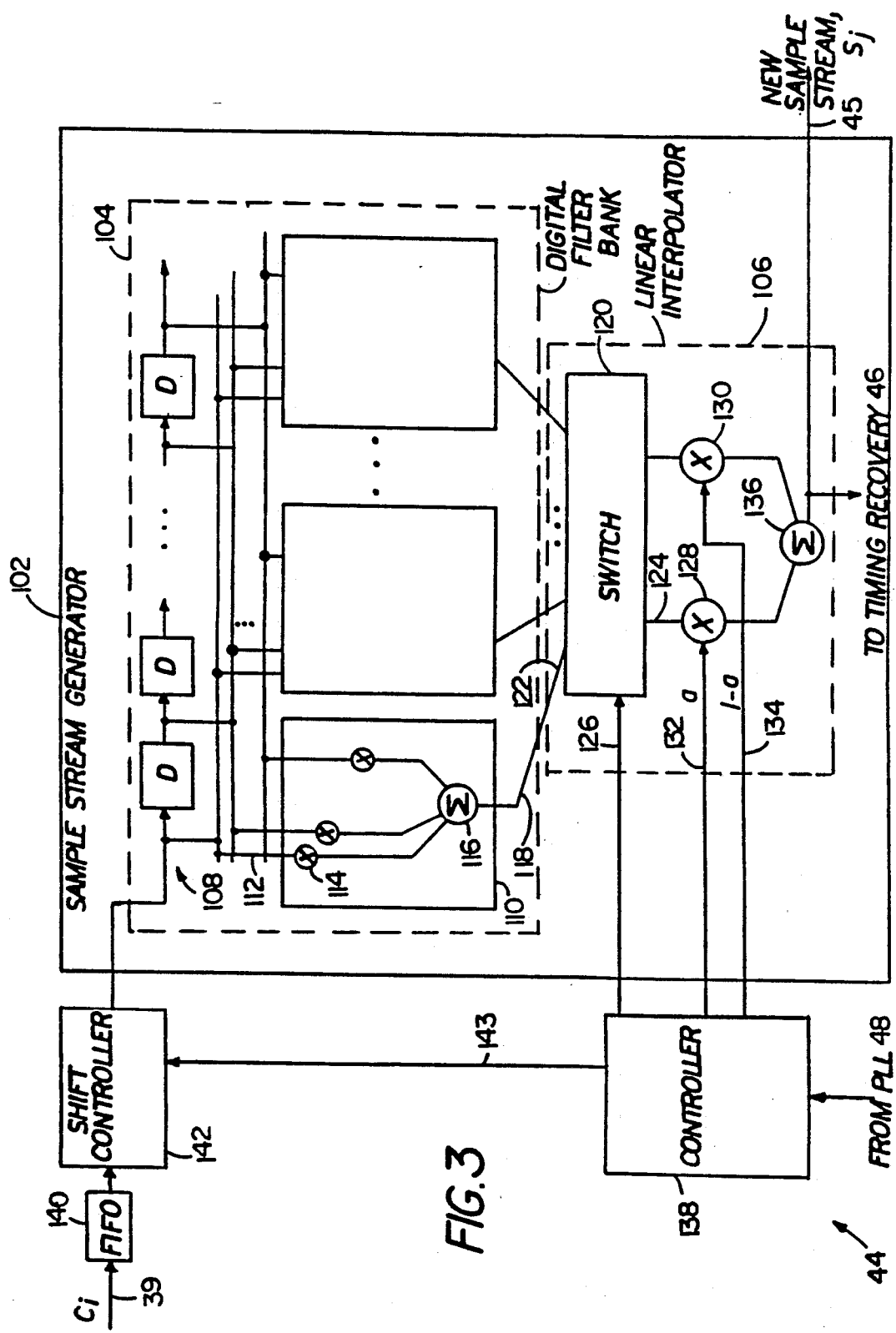
FIG. 3 is a block diagram of the sample rate converter.

Referring to FIG. 1, in a full duplex communication system 10, data messages are carried simultaneously in both directions between a remote data terminal equipment (DTE 12) and a local DTE 14 over a two-wire telephone line 16. A message is passed over the line from DTE 14 to DTE 12 by modulating a carrier signal (e.g., by conventional quadrature amplitude modulation) in a succession of baud intervals (each $L_x$ long) in accordance with a series of symbols (appearing at the local transmission baud rate of $1/L_x$) that represent the message. Transmission from remote DTE 12 occurs at a possibly different baud rate of $1/R_x$. Modulation and demodulation of the carrier is done by a remote modem 18 associated with the remote DTE 12, and by a local modem 20 for local DTE 14. (Because remote modem 18 is similar to local modem 20 only local modem 20 is described below.)

Modem 20 includes a conventional hybrid 22 that both passes the modulated transmission carrier onto line 16 and continually detects the signal present on line 16 (that signal includes components related to both modulated carriers originating at both ends of line 16).

The local modulated transmission carrier originates at a conventional digital QAM encoder/modulator 24 which generates a series of encoded and modulated complex-valued symbols. The symbols are passed through a transmit filter 25 to generate real valued samples which are converted to an analog signal in digital-to-analog converter (DAC) 26, and then passed via a conventional low-pass filter 28 to hybrid 22. The output of transmit filter 25 comprises a sequence of digital samples appearing at a first sampling rate which is some integer value N times the local transmission symbol rate ($1/L_x$) (N is chosen so that $N/L_x$ is above the Nyquist sampling rate). DAC 26 is clocked to accept the values at that same rate by a local clock 30 (described below).

The analog line signal detected by hybrid 22 is passed via a conventional bandpass filter 32 to an analog-to-digital converter (ADC) 34 which samples it at rate $N/L_x$. The clock for ADC 34 is delivered from local clock 30. The output digital samples are delivered to an adder 38 which effectively subtracts from each received digital sample (delivered from ADC 34), a corresponding digital sample representative of the transmitted modulated carrier. This removes from the signal detected by hybrid 22, the portion which originated from modem 20, and leaves only the portion sent from the remote modem 18. The transmitted samples used by adder 38 are generated in an echo canceller 40 using a conventional transversal adaptive filter based on the output of encoder/modulator 24.

The received, echo cancelled, sample stream delivered by adder 38 (on a line 39) must be demodulated and decoded in a receiver 42 for delivery of the message to DTE 14. The sample stream must be provided to receiver 42 at a sampling rate of say $P/R_x$ (where P is an integer typically the same as N), rather than at the first sampling rate $N/L_x$ of element 38. And the new sample stream must accurately reflect the information contained in the original received sample stream.

The new sample stream (carried on line 45) is generated by a digital asynchronous sample rate converter 44 based on the sample stream on line 39 and on clock phase information about the remote transmission baud rate $1/R_x$. That clock phase information is derived from the new sample stream (in a manner described below) by a timing recovery unit 46 which in turn feeds a second-order digital timing phase-locked loop (PLL) 48. Timing recovery unit 46 is of a known type, for example, as described in Qureshi, U.S. Pat. No. 4,344,176, issued Aug. 10, 1982, assigned to the same assignee as this application, and incorporated herein by reference. PLL 48 is similar to the kind described in Qureshi et al., U.S. Pat. No. 4,563,657, issued Jan. 7, 1986, assigned to the same assignee as this application, and incorporated herein by reference. PLL 48 delivers as an output on line 49 a succession of error values each of which represents the difference between the sampling phase of a given sample on line 39 at the local transmitter sampling rate $N/L_x$ and an optimal sampling phase (at the remote transmitter rate $P/R_x$).

Referring to FIG. 2, as an example, define $C_i$ as the i-th sample in the input sample stream of converter 44 (on line 39, FIG. 1) and $S_j$ as the j-th sample in the output sample stream (on line 45). Then the stream of samples $C_i$ represents (at rate $N/L_x$) the analog modulated carrier signal originating at the remote modem, and it is desired to have the stream of samples $S_j$ also accurately represent (at rate $P/R_x$) that same analog signal.

Suppose that the rate ($N/L_x$) of the samples $C_i$ is nominally $\frac{2}{3}$ the rate ($P/R_x$) of the samples $S_j$. The sampling phase difference between each sample $C_i$ and a corresponding sample $S_j$ can be represented as $d_i$.

The function of converter 44 in the example is to generate samples $S_j$, given samples $C_i$, in such a way that the samples $S_j$ represent the same information as that contained in samples $C_i$ but appear at any desired different sampling rate. Note that each successive sample $S_j$ must have a greater sampling phase offset $d_i$ from the corresponding sample $C_i$, than did the preceding sample $S_{j-1}$ relative to its corresponding sample $C_{i-1}$. Also, note that the sample $S_9$ has a sampling phase offset ($d_8$) relative to $C_9$ that is equal to a full sampling interval $R_x/P$ of samples $S_j$ plus an amount equal to $d_i$ (and is equal to a full sampling interval $L_x/N$ of sample stream $C_i$). Samples $S_{10}$, $S_{11}$, . . . have even larger sampling phase offsets from $C_{10}$, $C_{11}$, . . . .

Sample rate converter 44 is capable of providing, for each input sample $C_i$, a corresponding output sample $S_j$ with any predetermined sampling phase offset $d_i$ such that $S_j$ represents the information in the corresponding time segment of the original analog line signal. By controlling the successive sampling phase offsets of successive $S_j$s relative to their corresponding $C_i$s, sample rate converter 44 generates the desired output sample stream.

Referring to FIG. 3, sample rate converter 44 includes a sample stream generator 102 whose output is tied to line 45. Sample stream generator 102 has a digital filter bank 104 that feeds a linear interpolator 106 which in turn delivers samples $S_j$ to line 45.

The exact sampling phase position (i.e., position in time) of each output sample $S_j$ is controlled in three stages. A coarse stage positions sample $S_j$ within $2\pi$—one full interval $L_x/N$—of its desired location. A medium stage positions sample $S_j$ within $2\pi/M$ of its desired location, for M a predetermined integer, e.g., 8. A fine stage positions sample $S_j$ at any desired position within the $2\pi/M$ segment.

To accomplish the medium stage of sampling phase offset, digital filter bank 104 is provided with a Q sample long delay line 108 (e.g., Q=7) and a set of M digital subfilters 110.

Each subfilter has Q+1 inputs 112 tied to the respective taps of delay line 108, a set of multipliers 114, and a summer 116. The taps of the delay line are spaced at $L_x/N$ intervals and the m-th subfilter 110 (when selected) uses the sample information at its inputs 112 to generate a single output sample $V_m$ on its output line 118. The sampling phase position of $V_m$ is governed by the coefficients of the multipliers 114 of the m-th subfilter.

As explained below, only two of the subfilters 110 are needed to generate an output sample $S_j$. Thus only two sets of multipliers need to be provided and the two appropriate tap coefficient sets can be fetched from memory for use in the two sets of multipliers. This reduces the implementation complexity.

The coefficients of the m-th subfilter are chosen to give it a frequency response of $$H_m(f) = A(f) \exp(j(T_o + 2\pi m/N))$$

for m=0, . . . , M−1, where A(f) is nearly a constant for frequencies between the low and high cut-off frequencies of the received line signal, and $T_o$ is a constant.

Thus the amplitude characteristics of all subfilters are essentially flat in the passband of the line signal and nearly identical one to another. The envelope or group delay characteristic of each subfilter is nearly constant as a function of frequency, but their respective group delay characteristics differ by the same amounts in the passband such that the sampling phase offsets achieved by the M different filters are distributed uniformly at $1/M$ intervals within each input sample interval $L_x/N$.

The coarse stage of sampling phase offset is achieved by the choice of positioning of the input sample sequence in delay line 108, controlled in a manner described below. For a given arrangement of samples in delay line 108, if the output of the m-th filter has a particular sampling phase offset W, then shifting all of the samples one position right in the delay line will cause the output of that m-th filter to have a sampling phase offset of $W+2\pi$.

The fine stage of sampling phase offset is achieved by the linear interpolator 106. Interpolator 106 includes a switch 120 whose M inputs 122 are connected respectively to the outputs 118 of the M subfilters 104. Switch 120 has two outputs 124 and is capable of connecting any two adjacent inputs 122 to its two outputs 124 under control of a signal received over a line 126. (For this purpose, the rightmost and leftmost inputs 122 are considered to be adjacent when considered in conjunction with an appropriate coarse sampling phase adjustment of $2\pi$.)

The outputs 124 feed two conventional multipliers 128, 130, which multiply them respectively by two coefficients (a and 1−a) supplied over lines 132, 134. The outputs of multipliers 128, 130 are then fed to a summer 136 whose output is connected to line 45.

Linear interpolator 106 thus effectively delivers an output sample $S_j$ having a sampling phase offset whose magnitude is between W and $W+2\pi/M$ (the sampling phase offsets of the two selected subfilters' (intermediate) output samples), the exact sampling phase offset being determined by the value of a.

The interpolator introduces some distortion caused by aliasing; however, the amount of distortion introduced in conjunction with even a relatively small number of subfilters (e.g., M=8) is comparable to the distortion produced by a relatively large number of subfilters (e.g., M=160) used without a subsequent linear interpolation. Thus the invention greatly reduces the amount of memory required for storing tap coefficients.

The control signals on lines 126, 132, 134 are generated by a controller 138 based on information received from PLL 48 indicating the amount of sampling phase offset required for the next output samples $S_j$.

Controller 138 also sends control signals via a line 143 connected to a shift controller 142, which governs the delivery of samples $C_i$ into delay line 108.

Shift controller 142 is supplied with samples $C_i$ from line 39 via, e.g., a 16 sample long first-in, first-out (FIFO) buffer 140. Samples $C_i$ are clocked into FIFO buffer 140 at the rate $N/L_x$ based on local clock 30 (FIG. 1). Shift controller 142 moves samples out of FIFO buffer 140 and into delay line 108 at intervals specified by controller 138.

Generally, the samples from FIFO 140 are shifted into delay line 108 at rate $P/R_x$. However, when $P/R_x$ differs from $N/L_x$, the shift controller 142 occasionally must skip shifting a sample into the delay line or must shift two samples at once into the delay line. The reason for this can be seen in the fact that on average the rate at which samples are withdrawn from FIFO 140 must be the same as the rate at which they enter FIFO 140, i.e., $N/L_x$. Thus, for example, if $P/R_x > N/L_x$, shift controller 142 must occasionally skip shifting a sample to reduce the average rate at which samples enter the delay line.

Suppose $N/L_x$ is $\frac{7}{8}$ of $P/R_x$, as shown in FIG. 2. If the subfilters 110 are arranged such that the left-most (m=0) subfilter produces no sampling phase offset, the next subfilter (m=1) produces $2\pi/M$ offset, and so on, then for the first eight input samples $C_i$, the output samples $S_j$ are taken from the subfilters shown in the following table. (Those first eight samples $C_1$–$C_8$ are entered into the delay line at rate $P/R_x$.)

| Input | Output | Phase Shift | Subfilter Used (m) |
|-------|--------|-------------|--------------------|
| $C_1$ | $S_1$ | $d_0 = 0$ | 0 |
| $C_2$ | $S_2$ | $d_1 = -2\pi/8$ | 1 |
| $C_3$ | $S_3$ | $d_2 = -4\pi/8$ | 2 |
| $C_4$ | $S_4$ | $d_3 = -6\pi/8$ | 3 |
| $C_5$ | $S_5$ | $d_4 = -8\pi/8$ | 4 |
| $C_6$ | $S_6$ | $d_5 = -10\pi/8$ | 5 |
| $C_7$ | $S_7$ | $d_6 = -12\pi/8$ | 6 |
| $C_8$ | $S_8$ | $d_7 = -14\pi/8$ | 7 |

At this point, shift controller 142 is instructed to skip shifting a sample into the delay line, which in effect produces a $-2\pi$ shift in the outputs of all subfilters. Thus $d_8$, which is $-16\pi/8 = -2\pi$, is achieved by taking the eighth sample from subfilter m=0, and so on.

Of course, if $P/R_x$ were less than $N/L_x$, the opposite situation would pertain and the subfilters would be used in reverse order with an additional sample being shifted after the lowest order subfilter is used.

When finer increments of sampling phase offset are required, linear interpolation is used and in that case two subfilters must generate intermediate samples to be combined in the interpolator; when larger shifts are required, the subfilters used for successive samples $S_j$ may not be adjacent as they were in the example given above. For very large shifts, a coarse adjustment may also be required.

Controller 138 uses conventional logic (not shown) to coordinate the shift controller 142, the switch 120, and the delivery of coefficients a and 1−a, in order to achieve the proper sampling phase offset for each output sample $S_j$, based on the signals from PLL 48 indicating the needed amount of sampling phase offset. Note that controller 138 is thus not restricted to dealing with only fixed rates $N/L_x$ or $P/R_x$ but can operate adaptively as the sampling phase offset signals generated by PLL 48 vary.

Figure 4:
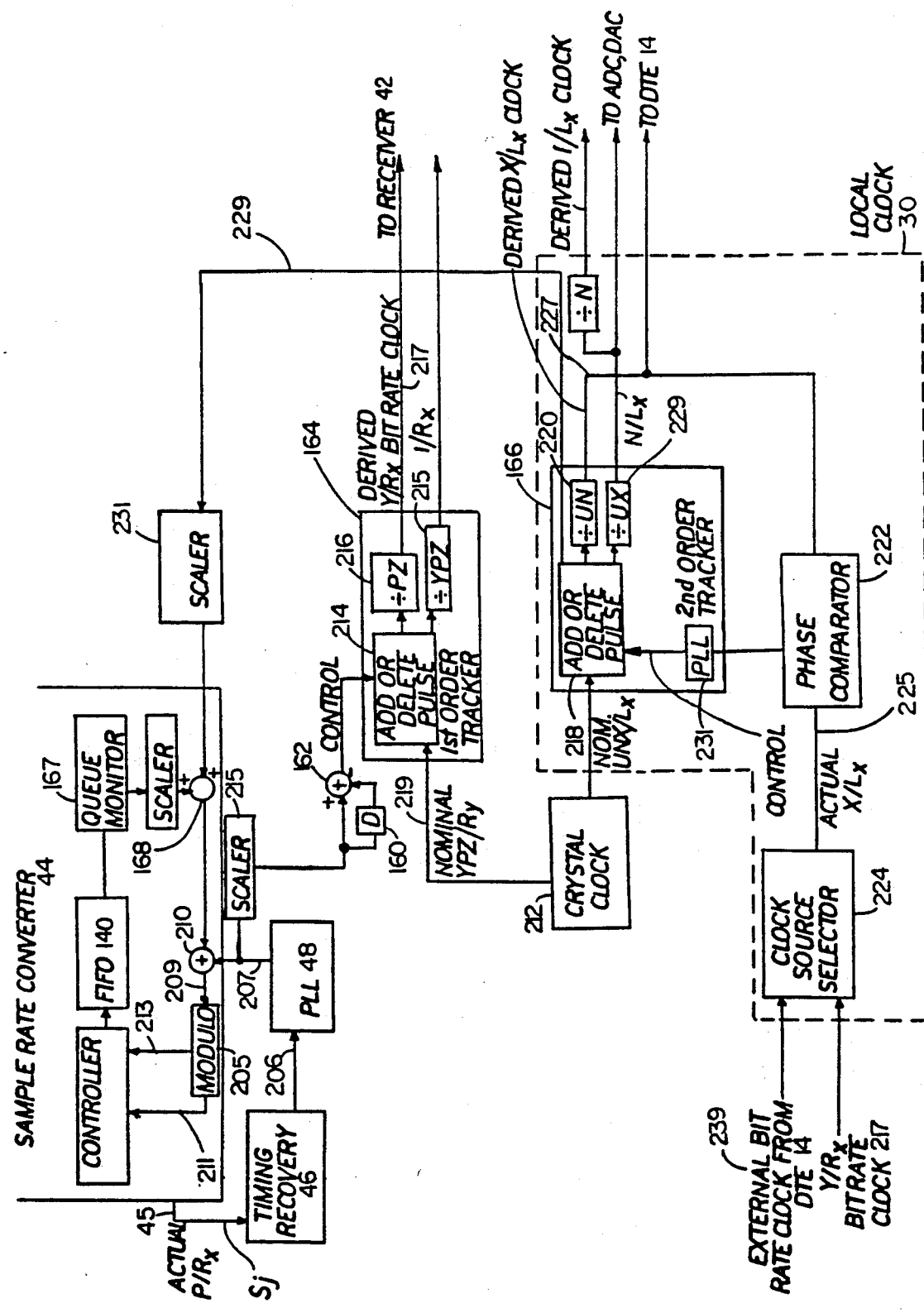
FIG. 4 is a block diagram including phase tracker and queue monitor circuitry.

Referring to FIG. 4, timing recovery block 46 receives the output samples $S_j$ (from converter 44) at an actual rate $P(R_x)$ and determines the difference between the actual sampling phase of each sample $S_j$ (on line 45) and an optimal sampling phase (at rate $P/R_x$) implied in the actual sample sequence $S_j$ and determined by e.g., a maximum band edge energy criterion. Signals representing the phase difference information are delivered on line 206 to PLL 48. When there is no phase difference the output on line 206 is zero; otherwise, it is a value representing the magnitude of the phase error. PLL 48 uses the values on line 206 in generating 15-bit output signals each of which represents the sampling phase offset between the optimal sampling phase (at rate $P/R_x$) and the local actual transmitter sampling phase at rate $N/L_x$. PLL 48 is a second order phase locked loop; therefore even when the input of line 206 is zero, the output value may be increasing or decreasing by regular increments in order to maintain the desired constant rate differential between the rate $P/R_x$ and the rate $N/L_x$. When the input on line 206 is non-zero, the output of PLL 48 will be adjusted to cause a change in the rate differential in order to drive the value on line 206 toward zero. The output of PLL 48 passed to an adder 210 (whose function will be described below) and from there via line 209 to a modulo unit 205. The value on line 209 is expressed as modulo (the local transmitter sampling interval $N/L_x$), i.e., multiples of $2\pi$ are eliminated and only the remaining part of the sampling phase offset—less than $2\pi$—is delivered on line 211 for use by converter 44. As part of the modulo operation 205, for each $2\pi$ amount of sampling phase offset that is eliminated, modulo 205 provides a pulse on line 213 to controller 138 which in turn results in a coarse adjustment signal on line 143 (FIG. 3).

The output of PLL 48 is also passed through a scaler 215 and then both directly, and via a delay element 160, to a summer 162. The output of summer 162 thus represents the change from interval to interval in the amount of sampling phase offset between the samples at rate $N/L_x$ and the optimal sampling phase of the samples $S_j$ at $P/R_x$. A first order tracker 164 uses the output of adder 162 to generate a stable derived bit-rate clock $Y/R_x$ on line 217 (Y is the number of bits per symbol) synchronized to the remote transmitter bit-rate clock using a high-speed stable clock at a nominal rate of $YPZ/R_z$ (generated on line 219 from a crystal clock 212) for use in clocking the samples $S_j$ from receiver 42 to the local DTE 14 (FIG. 1).

To achieve this, first order tracker 164 receives from fixed rate crystal clock 212 pulses at a rate YPZ times the nominal remote transmitter rate $1/R_x$ (Z is an integer). In tracker 164, the clock $YPZ/R_x$ is passed through a block 214 which adds or deletes pulses under control of the output of summer 162. The output of block 214 is passed through a divide-by-ZP element 216 to generate the derived $Y/R_x$ bit rate clock, and is separately passed through a divide-by-YPZ element 215 to generate a derived $1/R_x$ baud rate clock. When the sampling phase offset between the samples at rate $P/R_x$ and the samples at rate $N/L_x$ is not changing, the output of summer 162 is zero, block 214 is not activated, and the derived $Y/R_x$ bit rate clock and $1/R_x$ baud rate clock have fixed frequencies based directly on the crystal clock 212. Otherwise, the output of summer 162 is non-zero and the derived $Y/R_x$ bit rate clock (and $1/R_x$ baud rate clock) is varied to reflect the changes. Thus, the first order tracker uses the information derived from the samples $S_j$ to derive bit rate and baud rate clocks that track the actual remote transmitter bit rate.

If the local transmitter sample rate clock $N/L_x$ 30 (FIG. 1) is stable (e.g., directly derived from a precision crystal oscillator), the arrangement described above will ensure stable operation; sample rate converter 44 will be adjusted automatically to accommodate changes in rate $P/R_x$.

However, if the local transmitter sample rate clock 30 is synchronized with an external clock (e.g., an external bit rate clock 239 from DTE 14) or the derived receiver bit rate clock $Y/R_x$ 217 in a timing loopback scheme (as selected by a clock selector 224), phase jitter or frequency shifts may be introduced into the actual local transmitter bit-rate clock $X/L_x$. Because the samples $S_j$ are derived from the received echo cancelled samples which had been sampled at a rate $N/L_x$ governed by the local transmitter clock 30, the timing changes in clock 30 will also affect the samples $S_j$ which the receiver processes, possibly degrading the performance of the receiver or causing instability in the modem operation.

To reduce the effects of these problems, local clock 30 is provided with a second order timing tracker and phase compensation circuit 166 including a second order PLL 231, an add or delete pulse block 218, and a divide-by-U element 220. One input to tracker 166 is a fixed rate clock (at UNX times the nominal local transmit clock rate $1/L_x$, U an integer) generated by crystal clock 212. One output of tracker 166 is a derived clock $X/L_x$ which tracks the actual $X/L_x$ clock on line 225 but smoothes out jitters and frequency shifts.

To accomplish this, a phase comparator 222 compares the phase of the derived clock on line 227 with the actual clock on line 225 and delivers an error signal to PLL 231. If the error signal is zero, PLL 231 continues to deliver control signals to add or delete 218 to cause the addition or deletion of clock pulses at a rate that keeps the derived clock on line 227 in phase with the actual clock on line 225. If the error signal from phase comparator 222 is non-zero then the PLL output is adjusted to drive the phase of the derived clock toward the phase of the actual clock. The effect of the PLL is to accumulate and smooth the phase error signals from phase comparator 222. Note that the pulses deleted or added in 218 reflect phase changes in the ADC 34 sampling clock (FIG. 1) relative to a nominal stable sample rate clock derived from crystal clock 212, and thus reflects the sampling phase changes in the samples $C_i$. The output of add or delete 218 is delivered to a divide-by-UN element 220 to convert it to a clock at rate $X/L_x$ (for delivery to DTE 14) and is separately divided by UX in element 229 to generate a sample rate clock $N/L_x$ for delivery to ADC 34 and DAC 26 (FIG. 1). The $N/L_x$ clock is further divided by N to generate baud rate clock $1/L_x$. The number of pulses added or deleted by 218 is also sent over line 229, through scaler 231 and via a summer 168 (to be described below) to another summer 210 where it is added to the output of PLL 48. In this way the rate shift accomplished by the controller 138 is adjusted to compensate for jitter and frequency shifts in the non-stable external clock or loopback clock selected by clock source selector 224.

It may prove impossible, even by this arrangement, to maintain an exact synchronism between the locally derived receiver bit-clock $Y/R_x$ on line 217 (which is synchronized with the rate of the rate converter that generates the $S_j$'s) and the actual remote transmitter bit-rate clock $Y/R_x$ on line 45; in that case the FIFO buffer 140 will, over time, tend to become empty or full. To prevent either situation, and to maintain a medium level of occupancy of FIFO 140, a FIFO queue monitor 167 senses the occupancy level of the FIFO. When the occupancy is consistently above or below the medium level, it issues a value which is added in adder 168 to the output of tracker 166 thereby causing an adjustment of the output of PLL 48 via summer 210. This also effectively corrects the phase of the locally derived $Y/R_x$ clock via timing recovery 46, PLL 48, and scaler 215. The timing corrections made by monitor 167 are assumed to be small over the time lengths of interest. For example, if the variation of the local transmitter clock period $L_x$ is on the order of microseconds, the number of samples in FIFO buffer 140 will shrink or grow noticeably only after a time on the order of ten seconds. Monitor 167 checks the FIFO buffer 140, e.g., every ten seconds. If the number of samples in buffer 140 has grown or shrunk, monitor 167 asserts a signal via adder 168 which affects the operation of controller 138 accordingly.

In the case of loopback timing, the derived $Y/R_x$ clock is returned through the clock source selector 224 to phase comparator 22 in order to control the local transmitter clock. Thus, for example, if FIFO 140 is becoming too full, the resulting increase in the rate $Y/Rx$ (designed to empty the FIFO faster) will also cause an increase in the local transmitter clock, causing an increase in the rate at which samples are loaded into the FIFO (and thus, by positive feedback, defeating the desired goal). To prevent possible instability the output of the queue moitor is added to the output of PLL 48, rather than directly to the derived $Y/Rx$ bit rate clock (thus forming a negative feedback loop). This has the disadvantage of disturbing what may otherwise be a stable output of PLL 48, but because the adjustments by the queue monitor are small and infrequent, the disturbance is not a problem.

Thus, the timing adjustments due to transmitter bit rate clock $X/L_x$ jitter (on line 229) and derived bit rate $Y/R_x$ clock asynchronism (represented by the output of queue monitor 167) are combined by adder 168 and applied against the output of PLL 48 in summer 210.

The rate converter 44, queue monitor 167, PLL 48, and trackers 164, 166 may be implemented by programming two cooperating microprocessors that are also used to perform other modem functions and are configured in the manner described in Qureshi et al., U.S. patent application Ser. No. 586,681, filed Mar. 6, 1984, assigned to the same assignee as this application, and incorporated herein by reference.

The ability of the converter 44 to shift the sampling phase of a sample by any amount enables the sampling phase to be set at an optimal value, thus reducing timing phase acquisition time (when incorporated with an accurate timing phase estimation scheme), reducing turn-around time, and increasing throughout, for example, when applied to a two-wire half-duplex modem.

Other embodiments are within the following claims. For example, the converter 44 could be used with modems having two or more channels of received signals at different signaling rates.

We claim:

1. In a modem in which a line signal is sampled at times governed by an unstable clock to generate a first sample stream in which the samples appear with possibly changing sampling phases and a converter converts the first sample stream to a second stream of samples appearing at times that are possibly different from the times of appearance of the samples in the first sample stream, the improvement comprising a stable clock delivering pulses at a nominal rate related to the rate of pulses of said unstable clock, and means for providing to said converter phase signals representative of the changing sampling phases in the first sample stream relative to the pulses of the stable clock to cause said conversion to occur in a manner that reduces the contribution of said changing sampling phases to the times of appearance of the samples in said second sample stream.

2. The improvement of claim 1 wherein said unstable clock is provided from a data terminal equipment associated with said modem.

3. The improvement of claim 1 wherein said means for providing phase signals comprises
means for generating said phase signals based on detecting changes in phase of said unstable clock pulses relative to the pulses of said stable clock.

4. The improvement of claim 1 where said means for providing signals includes an add or delete pulse circuit for generating a derived clock from said stable clock by adding or deleting pulses to or from said stable clock, and
a comparator for generating comparisons of the phases of said unstable clock pulses with the phases of pulses of said derived clock,
said add or delete pulse circuit operating in response to said comparisons.

5. The improvement of claim 1 wherein said converter comprises conversion circuitry and a buffer for temporarily storing samples of said first sample stream for delivery to said conversion circuitry, said samples being stored in said buffer at a first rate derived from said unstable clock, said samples being accepted by said conversion circuitry at a possibly different second rate based on said signals provided to said converter, said improvement further comprising
a monitor for monitoring the occupancy status of said buffer and causing said first rate to be adjusted so that said buffer is normally not empty or full.

6. The improvement of claim 1 wherein
said first sample stream represents a time-varying signal, said second sample stream is also representative of said time-varying signal, and each second stream sample appears at a desired time, said converter comprising
filter circuitry for receiving said first stream and for generating at least two intermediate samples which appear at different times, and
interpolation circuitry for combining selected intermediate samples to form a sample of said second stream at said desired time.

7. Apparatus for receiving an input stream of samples representative of a time-varying signal and generating a corresponding output stream of samples which is also representative of said time-varying signal and in which each output stream sample appears at a desired time which may differ from the time when a sample appears in said input stream, said input sample stream being sampled based on a clock derived from an unstable clock having a nominally fixed rate subject to instabilities, said apparatus comprising
filter circuitry for receiving said input stream and for generating at least two intermediate samples which appear at different times,
interpolation circuitry for combining selected said intermediate samples to form a sample of said output stream at said desired time, said intermediate samples being selected and said interpolation circuitry being controlled in response to the difference between the sampling phase of the input stream and the sampling phase of the output stream, and
means for reducing said instabilities in said unstable clock.

8. Apparatus for use with a full-duplex, echo cancellation modem comprising
an input for receiving an input stream of samples derived by said modem from a time varying line signal, said input stream appearing at a rate related to the transmission baud rate of said modem,
an output for delivering to said modem, for use in deriving data carried by said line signal, a corresponding output stream of samples which is representative of said time-varying line signal and in which each output stream sample appears at a desired time which may differ from the time when a sample appears in said input stream, said output stream of samples appearing at a rate, possibly different from the input stream sample rate, related to the transmission baud rate of a modem at the other end of said line,
filter circuitry for receiving said input stream and for generating at least two intermediate samples which appear at different times, and
interpolation circuitry for combining selected said intermdiate samples to form a sample of said output stream at said desired time.

9. Apparatus for receiving an input stream of samples representative of a time-varying signal and generating a corresponding output stream of samples which is also representative of said time-varying signal and in which each output stream sample appears at a desired time which may differ from the time when a sample appears in said input stream, comprising
filter circuitry for receiving said input stream and for generating at least two intermediate samples which appear at different times, said filter circuitry having a plurality of transversal filters for generating said intermediate samples simultaneously using two or more different sets of coefficients, each set for generating one of said intermediate samples, and
interpolation circuitry for combining selected said intermediate samples to form a sample of said output stream at said desired time.

10. Apparatus for receiving an input stream of samples representative of a time-varying signal and generating a corresponding output stream of samples which is also representative of said time-varying singal and in which each output stream sample appears at a desired time which may differ from the time whien a sample appears in said input stream, comprising
filter circuitry for receiving said input stream and for generating at least two intermediate samples which appear at different times, and
interpolation circuitry for combining selected said intermediate samples to form a sample of said output stream at said desired time, said interpolation circuitry comprising a selector for selecting two said intermediate samples, and combining circuitry for performing a linear interpolation between said two intermediate samples, and wherein the coefficients for said linear interpolation are based on a measure of the difference between the sampling phase of said input stream and the sampling phase of the output stream.

11. The apparatus of claim 7, 8, 9, or 10 wherein said filter circuitry comprises a plurality of sets of coefficients each set for generating one of said intermediate samples.

12. The apparatus of claim 11 wherein said filter circuitry comprises a plurality of transversal filters for generating said intermediate samples simultaneously using two or more different said sets of coefficients.

13. The apparatus of claim 11 wherein each one of said sets is chosen to be substantially flat in the frequency band represented by the time-varying signal and to have an envelope delay characteristic that differs from the envelope delay characteristics of another set by an amount which is nearly constant as a function of frequency within the frequency band.

14. The apparatus of claim 7, 8, or 9 wherein said output stream has a sample rate that differs from the sample rate of said input stream.

15. The apparatus of claim 14 wherein said input stream is a stream of samples derived by a modem from a line signal, and said output stream is a stream of samples used by said modem to derive data carried by said line signal.

16. The apparatus of claim 15 wherein said modem is a full-duplex, echo cancellation modem, said input sample stream appears at a rate related to the transmission baud rate of said modem, and said output stream appears at a rate related to the transmission baud rate of a modem at the other end of said line.

17. The apparatus of claim 16 wherein the sampling phase difference between samples of said input stream and samples of said output stream varies over time, and further comprising means for selecting said intermediate samples and controlling said interpolation circuitry based on said varying difference.

18. The apparatus of claim 7, 8, or 10 wherein said interpolation circuitry comprises a switch for selecting two of said intermediate samples, and combining circuitry for performing a linear interpolation between said two intermediate samples.

19. The apparatus of claim 18 wherein the coefficients for said linear interpolation are based on a measure of the difference between the sampling phase of said input stream and sampling phase of said output stream.

20. The apparatus of claim 8, 9, or 10 wherein said input sample stream is sampled based on a clock derived from an unstable clock having a nominally fixed rate subject to jitter and frequency shifts, said output stream appears at a nominally fixed rate, and said intermediate samples are selected and said interpolation circuitry is controlled in response to the difference between the sampling phase of said input stream and the sampling phase of said output stream, said apparatus further comprising means for reducing said jitter and frequency shifts in said unstable clock.

21. The apparatus of claim 7, 8, 9, or 10 further comprising a buffer for temporarily storing said input stream samples for delivery to said filter circuitry, said samples being stored in said buffer at a first rate which is derived indirectly from said external clock, said samples being accepted by said filter circuitry at a possibly different average second rate based on an external clock, said apparatus further comprising a monitor for monitoring the occupancy status of said buffer and causing said average second rate to be adjusted so that said buffer is normally not full or empty.

22. The apparatus of claim 21 for use in a modem wherein said input sample stream comprises samples of a line signal, siad external clock corresponds to a baud rate of transmission on said line and said second rate is a clock corresponding to a transmission baud rate of a modem to the other end of said line, said transmission baud rate being derived locally by said modem.

23. A method for receiving an input stream of samples representative of a time-varying signal and generating a corresponding output stream of samples which is also representative of said time-varying signal and in which each output stream sample appears at a desired time which may differ from the time when a sample appears in said input stream, said input sample stream being sampled based on a clock derived from an unstable clock having a nominally fixed rate subject to instabilities, said method comprising receiving said input stream and generating, by filtering, at least two intermediate samples which appear at different times, interpolating selected said intermediate samples to form a sample of said output stream at said desired time, said intermediate samples being selected and said interpolation circuitry being controlled in response to the difference between the sampling phase of the input stream and the sampling phase of the output stream, and reducing said instabilities in said unstable clock.

24. For use in a modem in which a line signal is sampled at times governed by an unstable clock to generate a first sample stream in which the samples appear with possibly changing sampling phases and a converter converts the first sample stream to a second stream of samples appearing at times that are possibly different from the times of appearance of the samples in the first sample stream, the method comprising delivering stable clock pulses as a nominal rate related to the rate of pulses of said unstable clock, and providing to said converter phase signals representative of the changing sampling phases in the first sample stream relating to the pulses of the stable clock to cause said conversion to occur in a manner that reduces the contribution of said changing sampling phases to the times of appearance of the samples in said second sample stream.

* * * * *